(12) United States Patent
Hsieh et al.

(10) Patent No.: US 7,728,654 B2
(45) Date of Patent: Jun. 1, 2010

(54) CURRENT GENERATOR

(75) Inventors: Chih-Yuan Hsieh, Hsinchu (TW);
Maung Maung Win, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 12/204,794

(22) Filed: Sep. 4, 2008

(65) Prior Publication Data
US 2009/0289702 A1    Nov. 26, 2009

(30) Foreign Application Priority Data
May 20, 2008    (TW) ............................... 97118541 A

(51) Int. Cl.
*G05F 1/575*    (2006.01)
*G05F 1/56*    (2006.01)

(52) U.S. Cl. ........................ 327/543; 327/541; 323/314; 323/316

(58) Field of Classification Search ........................ None
See application file for complete search history.

(56) References Cited

U.S. PATENT DOCUMENTS

| | | | |
|---|---|---|---|
| 4,317,054 A * | 2/1982 | Caruso et al. ................ 327/539 |
| 6,570,436 B1 * | 5/2003 | Kronmueller et al. ....... 327/538 |
| 6,734,723 B2 * | 5/2004 | Huijsing et al. ................ 330/9 |
| 7,208,931 B2 * | 4/2007 | Aota ........................... 323/315 |
| 7,292,095 B2 * | 11/2007 | Burt et al. ....................... 330/9 |
| 7,463,082 B2 * | 12/2008 | Chen ........................... 327/543 |
| 7,560,979 B1 * | 7/2009 | Hsu et al. ..................... 327/539 |

* cited by examiner

*Primary Examiner*—Lincoln Donovan
*Assistant Examiner*—Terry L Englund
(74) *Attorney, Agent, or Firm*—Jianq Chyun IP Office

(57) ABSTRACT

A current generator, including a chopper stabilization operational amplifier, a transistor, and an impedance unit is provided. The chopper stabilization operational amplifier includes a first input terminal, a second input terminal, and an output terminal. The transistor includes a gate coupled to the output terminal of the chopper stabilization operational amplifier, a first source/drain coupled to the first input terminal of the chopper stabilization operational amplifier, and a second source/drain serving as a current output terminal of the current generator. The impedance unit includes a first terminal coupled to the first source/drain of the transistor, and a second terminal coupled to a first voltage.

9 Claims, 8 Drawing Sheets

CURRENT GENERATOR

CROSS-REFERENCE TO RELATED APPLICATION

This application claims the priority benefit of Taiwan application serial no. 97118541, filed on May 20, 2008. The entirety of the above-mentioned patent application is hereby incorporated by reference herein and made a part of this specification.

BACKGROUND OF THE INVENTION

1. Field of the Invention

The present invention generally relates to a current generator, and more particularly, to a current generator having a high efficiency and a high current matching.

2. Description of Related Art

FIG. 1A is a circuit diagram illustrating a conventional current mirror. Current mirror technology is a widely used method for providing a stable current. With respect to a conventional current mirror as shown in FIG. 1, a current of each channel is obtained by mirroring from a reference current $I_{REF1}$ via a transistor $T_{r1}$. Lower voltage drops between drain-sources of transistors $T_{r2}, T_{r3} \ldots$ are helpful for improving an efficiency of the current mirror in its entirety. However, in such a conventional current mirror, in order to decrease errors of the currents i1, i2 ... of the channels and improve the matching between the currents i1, i2 ... of the channels, the transistors $T_{r2}, T_{r3} \ldots$ of the current mirror cannot be designed for operating in a linear region and the transistors $T_{r2}, T_{r3}$ must be implemented with long channel transistors. Unfortunately, this causes great voltage drops between the drain-sources of the transistors $T_{r2}, T_{r3} \ldots$, thus decreasing the efficiency of the current mirror in its entirety.

FIG. 1B is a circuit diagram illustrating a current mirror further employing an operational amplifier. In order to improve the efficiency of the current mirror in its entirety, conventionally, operational amplifiers 101 are often employed for coupling with gates of the transistors $T_{r2}, T_{r3} \ldots$ of the current mirror, for introducing an operational amplifier 101 feedback mechanism. The operational amplifiers 101 are provided for controlling the transistors $T_{r2}, T_{r3} \ldots$ to operate in the linear region. The resistors R with small resistance are further employed for reducing additional voltage drops. In such a way, voltage drops between the drain-sources can be reduced, and the entire efficiency of the current mirror can be improved. However, different offset voltages of operational amplifiers 101 of different channels often cause errors of currents i1, i2 ... of the channels. This decreases the matching of the currents.

SUMMARY OF THE INVENTION

Accordingly, the present invention is directed to employ a chopper stabilization technology for eliminating the affection on the current matching caused by the offset voltages of the operational amplifiers. Meanwhile, the feedback mechanism of the operational amplifiers allows the transistors to operate in a saturation region, thus improving the stability of the currents of the channels. Or according to the practical application, the transistors are controlled to operate in the linear region, for obtaining a high efficiency in its entirety.

The present invention provides a current generator, including a chopper stabilization operational amplifier, a transistor, and an impedance unit. The chopper stabilization operational amplifier includes a first input terminal, a second input terminal, and an output terminal. The transistor includes a gate coupled to the output terminal of the chopper stabilization operational amplifier, a first source/drain coupled to the first input terminal of the chopper stabilization operational amplifier, and a second source/drain serving as a current output terminal of the current generator. The impedance unit includes a first terminal coupled to the first source/drain of the transistor, and a second terminal coupled to a first voltage.

According to an embodiment of the present invention, the chopper stabilization operational amplifier includes a first switch, an amplifier, and a second switch. The first switch includes a first terminal, a second terminal, a third terminal, and a fourth terminal. The first switch is adapted for selecting to couple the first terminal and the second terminal of the first switch to the third terminal and the fourth terminal of the first switch respectively, or to the fourth terminal and the third terminal of the first switch respectively, in which the first terminal and the second terminal of the first switch serve as the first input terminal and the second input terminal of the chopper stabilization operational amplifier, respectively. The amplifier includes a first input terminal and a second input terminal are respectively coupled with the third terminal and the fourth terminal of the first switch. The second switch includes a first terminal, a second terminal, a third terminal, and a fourth terminal. The second switch is adapted for selecting to electrically couple the first terminal and the second terminal of the second switch to the third terminal and the fourth terminal of the second switch respectively, or to the fourth terminal and the third terminal of the second switch respectively, in which the first terminal and the second terminal of the second switch are respectively coupled with the first output terminal and the second output terminal of the amplifier, respectively. The third terminal of the second switch serves as the output terminal of the chopper stabilization operational amplifier.

The present invention employs a feedback mechanism of a chopper stabilization operational amplifier in a current generator, in which it utilizes a chopper stabilization technology for eliminating the affection on the current matching caused by the offset voltages of the operational amplifiers, and thus obtaining a high matching of the currents of the channels. Meanwhile, the feedback mechanism of the operational amplifiers allows the transistors to operate in a saturation region, thus improving the stability of the currents of the channels. Or according to the practical application, the transistors are controlled to operate in the linear region, so as to ensure that the voltage drops between drain-sources of the transistors are controlled within a lowest range, for obtaining a high efficiency in its entirety.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
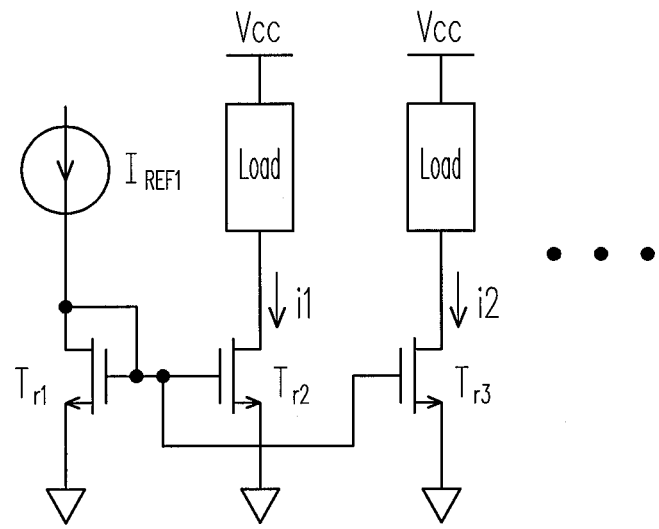
FIG. 1A is a circuit diagram illustrating a conventional current mirror.
Figure 1B:
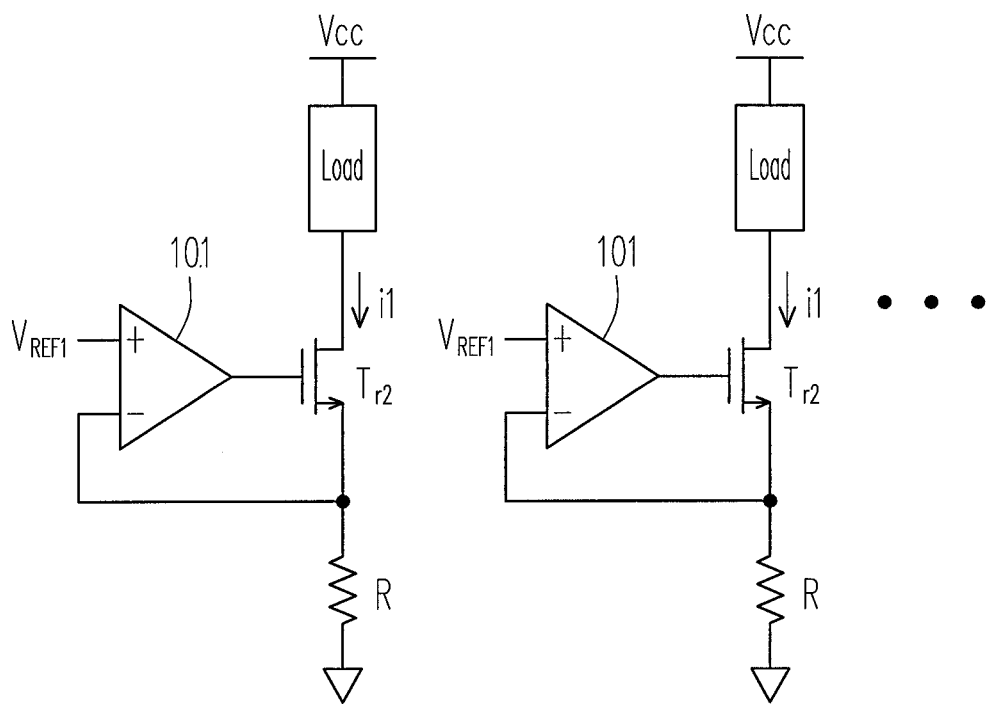
FIG. 1B is a circuit diagram of a conventional current mirror employing an operational amplifier.

Reference will now be made in detail to the present preferred embodiments of the invention, examples of which are illustrated in the accompanying drawings. Wherever possible, the same reference counting numbers are used in the drawings and the description to refer to the same or like parts.

Figure 2:
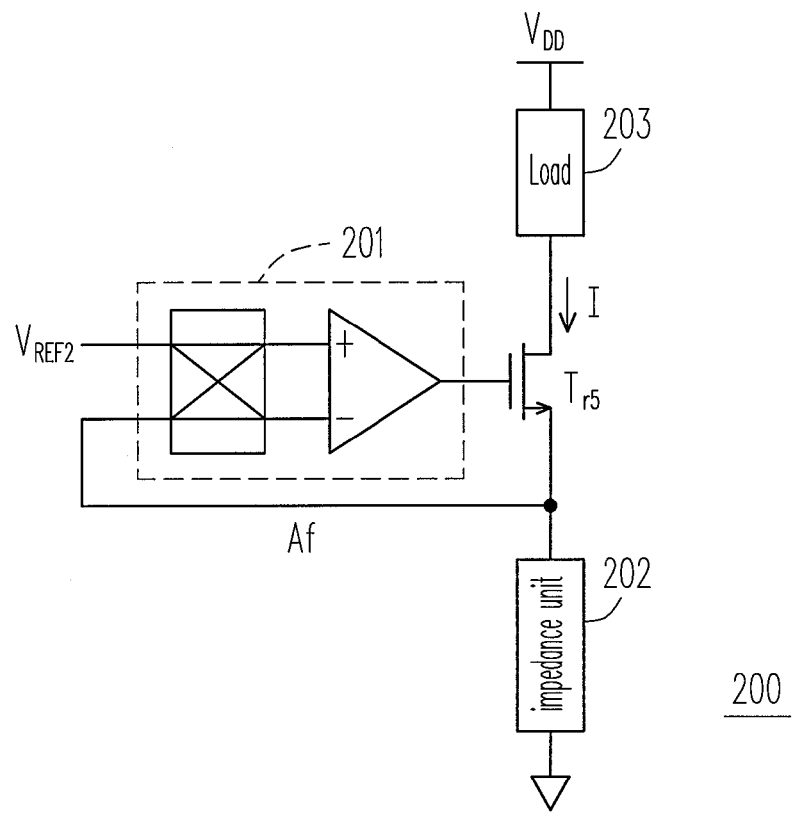
FIG. 2 is a circuit diagram illustrating a current generator according to an embodiment of the present invention.

FIG. 2 is a circuit diagram illustrating a current generator according to an embodiment of the present invention. Referring to FIG. 2, a current generator 200 includes a chopper stabilization operational amplifier 201, an impedance unit 202, and a transistor $T_{r5}$. The chopper stabilization operational amplifier 201 is hereby discussed with respect to its ideal features, including an indefinitely large input resistance (i.e., there is no current inputted into its input terminal), an output resistance approaching to zero, an indefinitely large open loop gain, an indefinitely large common mode rejection ratio, and an indefinitely large frequency bandwidth. Further, the chopper stabilization operational amplifier 201 is also adapted for eliminating low frequency noises and offset voltages.

The chopper stabilization operational amplifier 201 includes a first input terminal (exemplified with an inverting input terminal in the current embodiment) coupled with a first source/drain (exemplified with a source in the current embodiment) of the transistor $T_{r5}$, a second input terminal (exemplified with a non-inverting input terminal in the current embodiment) coupled with a reference voltage $V_{REF2}$, and an output terminal coupled with a gate of the transistor $T_{r5}$. The impedance unit 202 includes a first terminal coupled to the source of the transistor $T_{r5}$, and a second terminal coupled to a first voltage (exemplified with a grounding voltage in the current embodiment). A second source/drain (exemplified with a drain in the current embodiment) of the transistor $T_{r5}$ serves as an output terminal of the current generator 200. A load 203 is coupled between a second voltage (exemplified with a system voltage $V_{DD}$ in the current embodiment) and the output terminal of the current generator 200.

According to the current embodiment, the transistor $T_{r5}$ is an N-type metal oxide semiconductor (NMOS) transistor. However, the present invention is not restricted as such, and in other embodiments the transistor $T_{r5}$ can be other suitable transistors. The current embodiment receives a feedback signal Af via the inverting input terminal of the chopper stabilization operational amplifier 201, so as to control the transistor $T_{r5}$ working in a linear region, for decreasing a voltage drop between the source-drains of the transistor $T_{r5}$. Meanwhile, the chopper stabilization operational amplifier 201 causes the transistor $T_{r5}$ to generate a current I (equal to the reference voltage $V_{REF2}$ divided by the resistance of the impedance unit 202) corresponding to the reference voltage $V_{REF2}$. The impedance unit 202 can be realized by a resistor, a capacitor, an inductor, a transistor or any possible combination of the foregoing. The chopper stabilization operational amplifier 201 is capable of eliminating affection caused by noises and offset voltage at the input terminal thereof by itself. As such, the current I corresponding to the reference voltage $V_{REF2}$ is more stable and more accurate. Further, because the transistor $T_{r5}$ is operating in the linear region, the voltage drop between the source and drains is low, thus the current generator 200 has a high efficiency.

Figure 2A:
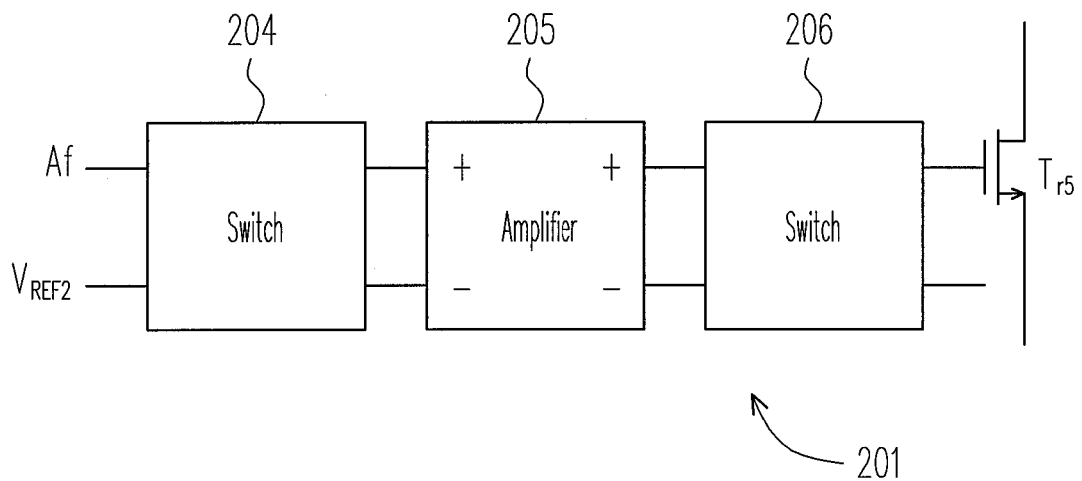
FIG. 2A is a block diagram illustrating an embodiment of a chopper stabilization operational amplifier of FIG. 2.

FIG. 2A is a block diagram illustrating an embodiment of a chopper stabilization operational amplifier 201 of FIG. 2. Referring to FIGS. 2 and 2A, in the current embodiment, the chopper stabilization operational amplifier 201 includes switches 204, 206, and an amplifier 205. A third terminal and a fourth terminal of the switch 204 are respectively coupled to a first input terminal (exemplified with a positive input terminal in the current embodiment) and a second input terminal (exemplified with a negative input terminal in the current embodiment) of the amplifier 205. A first output terminal (exemplified with a positive output terminal in the current embodiment) and a second output terminal (exemplified with a negative output terminal in the current embodiment) of the amplifier 205 are respectively coupled with a first terminal and a second terminal of the switch 206.

The switches 204 and 206 are provided with two connection modes. According to a first connection mode, a first terminal of the switch 204 is electrically connected with the third terminal of the switch 204, and a second terminal of the switch 204 is electrically connected with the fourth terminal of the switch 204; and the first terminal of the switch 206 is electrically connected with a third terminal of the switch 206, and the second terminal of the switch 206 is electrically connected with a fourth terminal of the switch 206. According to a second connection mode, the first terminal of the switch 204 is electrically connected with the fourth terminal of the switch 204, and the second terminal of the switch 204 is electrically connected with the third terminal of the switch 204; and the first terminal of the switch 206 is electrically connected with the fourth terminal of the switch 206, and the second terminal of the switch 206 is electrically connected with the third terminal of the switch 206.

When the first connection mode applies, the feedback signal Af received from the first terminal of the switch 204 (i.e., the first input terminal of the chopper stabilization operational amplifier 201) is outputted from the third terminal of the switch 204 to the positive output terminal of the amplifier 205, and the reference voltage $V_{REF2}$ received from the second terminal of the switch 204 (i.e., the second input terminal of the chopper stabilization operational amplifier 201) is outputted from the fourth terminal of the switch 204 to the negative input terminal of the amplifier 205. Synchronously, the switch 206 electrically connects the positive output terminal of the amplifier 205 to the gate of the transistor $T_{r5}$ via the first terminal and the third terminal (i.e., the output terminal of the chopper stabilization operational amplifier 201) of the switch 206.

When the second connection mode applies, the feedback signal Af received from the first terminal of the switch 204 is outputted from the fourth terminal of the switch 204 to the negative input terminal of the amplifier 205, and the reference voltage $V_{REF2}$ received from the second terminal of the switch 204 is outputted from the third terminal of the switch 204 to the positive input terminal of the amplifier 205. Synchronously, the switch 206 electrically connects the negative output terminal of the amplifier 205 to the gate of the transistor $T_{r5}$ via the second terminal and the third terminal of the switch 206.

The switches 204 and 206 are periodically and synchronously switched between the first connection mode and the second connection mode. Because of the switching operation of switches 204 and 206 between the first connection mode and the second connection mode, the amplified offset voltage and low frequency noises of the chopper stabilization operational amplifier 201 are opposite in phase when different connection modes apply. As such the offset voltage and the low frequency noises are compensated by themselves. In such a way, the generated current I is more accurate and more stable.

Figure 2B:
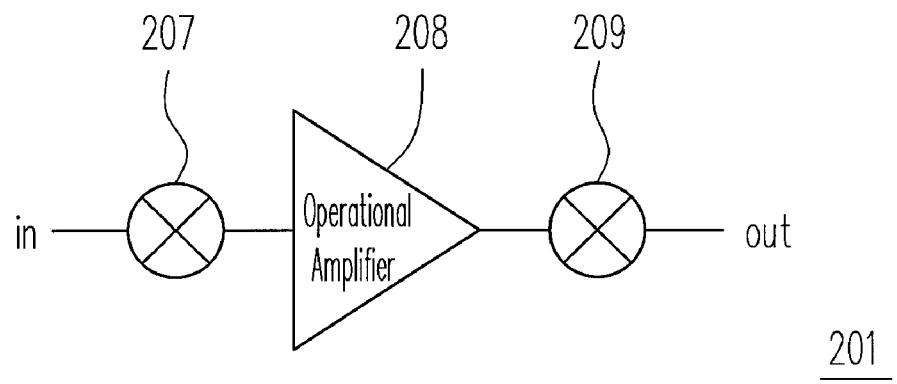
FIG. 2B is a block diagram illustrating another embodiment of a chopper stabilization operational amplifier of FIG. 2.

FIG. 2B is a block diagram illustrating another embodiment of a chopper stabilization operational amplifier 201 of FIG. 2. Referring to FIGS. 2 and 2B, in the current embodiment, the chopper stabilization operational amplifier 201 (e.g., as disclosed in "Design and Application of Fully Differential Chopper Stabilization Operational Amplifier", Ren-Hong DONG, Master Thesis of National Chi Nan University, June 2004) includes modulators 207 and 209, and an operational amplifier 208. The modulator 207 is coupled with the operational amplifier 208. The operational amplifier 208 is coupled with the modulator 209. When receiving an input signal (exemplified with the reference voltage $V_{REF2}$ in the current embodiment), the modulator 207 performs a first time modulation to the input signal, to shift a frequency of the original input signal to an odd-order harmonic of a chopper frequency, and then adds the low frequency noise and the offset voltage of the operational amplifier 208 thereto. After amplified by the operational amplifier 208, an output signal is performed with a second modulation by the modulator 209, in which the frequency of the signal is shifted back to a base frequency of the original, during which the low frequency noise and the offset voltage which are performed with only one time of modulation are shifted to the odd-order harmonic of the chopper frequency. In such a way, the chopper stabilization operational amplifier 201 is adapted for eliminating the offset voltage and the low frequency noise. And therefore, the generated current I is more accurate and more stable.

Figure 2C:
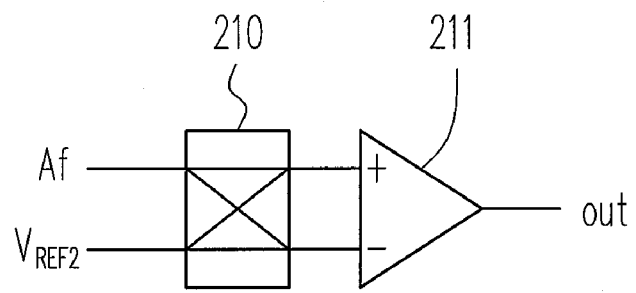
FIG. 2C is a block diagram illustrating a further embodiment of a chopper stabilization operational amplifier of FIG. 2.

FIG. 2C is a block diagram illustrating a further embodiment of a chopper stabilization operational amplifier 201 of FIG. 2. Referring to FIGS. 2 and 2C, in the current embodiment, the chopper stabilization operational amplifier 201 includes a switch 210 and an operational amplifier 211. A third terminal of the switch 210 is coupled to a first input terminal (exemplified with a non-inverting input terminal in the current embodiment) of the operational amplifier 211, and a fourth terminal of the switch 210 is coupled to a second input terminal (exemplified with an inverting input terminal in the current embodiment) of the operational amplifier 211. According to a first connection mode of the switch 210, the switch 210 outputs a feedback signal Af to the non-inverting input terminal of the operational amplifier 211 via a first terminal (i.e., the first input terminal of the chopper stabilization operational amplifier 201) of the switch 210, and the third terminal of the switch 210, and outputs the reference voltage $V_{REF2}$ to the inverting input terminal of the operational amplifier 211 via a second terminal (the second input terminal of the chopper stabilization operational amplifier 201) of the switch 210, and the fourth terminal of the switch 210. After amplified by the operational amplifier 211, the amplified voltage is outputted to the gate of the transistor $T_{r5}$. According to a second connection mode, the switch 210 outputs the feedback signal Af to the inverting input terminal of the operational amplifier 211 via the first and fourth terminals of the switch 210, and outputs the reference voltage $V_{REF2}$ to the non-inverting input terminal of the operational amplifier 211 via the second and third terminals of the switch 210. After amplified by the operational amplifier 211, the amplified voltage is outputted to the gate of the transistor $T_{r5}$. The switch 210 is adapted for periodically switching between the first connection mode and the second connection mode. Because of the switching operation of switch 210 between the first and second connection modes, the offset voltage and low frequency noises in the outputs of the chopper stabilization operational amplifier 201 are opposite in phase when different connection modes apply. As such the offset voltage and the low frequency noises are compensated by themselves. In such a way, the generated current I is more accurate and more stable.

Figure 3:
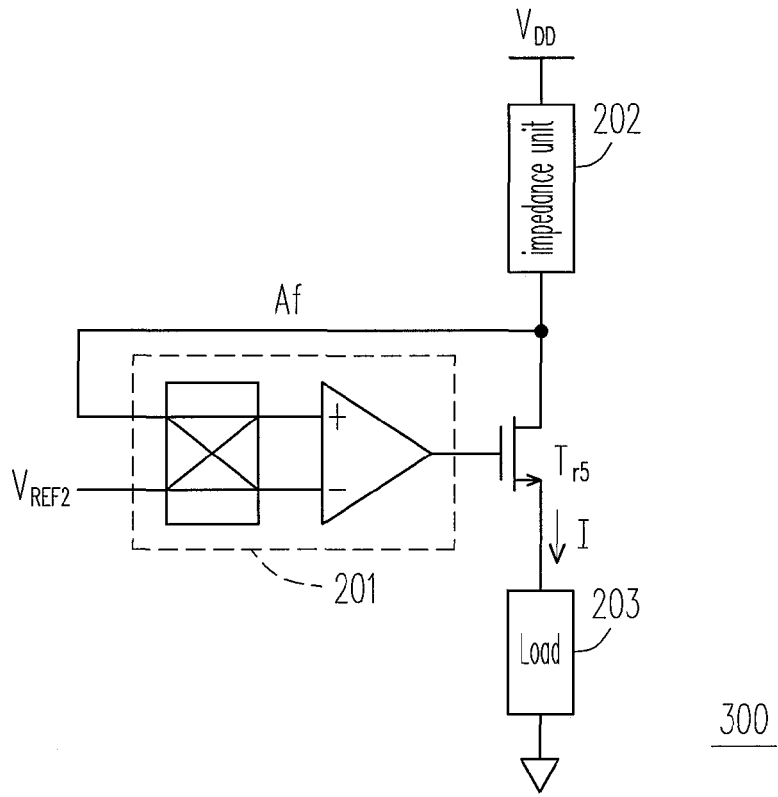
FIG. 3 is a circuit diagram illustrating a current generator according to another embodiment of the present invention.

FIG. 3 is a circuit diagram illustrating a current generator 300 according to another embodiment of the present invention. Referring to FIG. 3, a current generator 300 includes a chopper stabilization operational amplifier 201, an impedance unit 202, and a transistor $T_{r5}$. The chopper stabilization operational amplifier 201 includes a first input terminal (exemplified with a non-inverting input terminal in the current embodiment) coupled to a first source/drain (exemplified with a drain in the current embodiment) of the transistor $T_{r5}$, a second input terminal (exemplified with an inverting input terminal in the current embodiment) coupled to the reference voltage $V_{REF2}$, and an output terminal coupled to a gate of the transistor $T_{r5}$. The impedance unit 202 includes a first terminal coupled to the drain of the transistor $T_{r5}$, and a second terminal coupled to a first voltage (exemplified with a system voltage $V_{DD}$ in the current embodiment). A second source/drain (exemplified with a source in the current embodiment) of the transistor $T_{r5}$ serves as an output terminal of the current generator 300 coupled to one terminal of a load 203. Another terminal of the load 203 is coupled to a second voltage (exemplified with a grounding voltage in the current embodiment), so as to configure a power loop.

The transistor $T_{r5}$ of the embodiment is preferably an NMOS transistor. According to the current embodiment, the feedback signal Af is received from the non-inverting input terminal of the chopper stabilization operational amplifier 201 for controlling the transistor $T_{r5}$ to operate in the linear region, and thus is also adapted for decreasing the voltage drop of the transistor $T_{r5}$. Meanwhile, the chopper stabilization operational amplifier 201 causes the transistor $T_{r5}$ to generate a current I (equal to the system voltage VDD minus the reference voltage $V_{REF2}$ then divided by the resistance of the impedance unit 202) according to the reference voltage $V_{REF2}$. According to the features of the chopper stabilization operational amplifier 201 as discussed above, the generated current I corresponding to the voltage $V_{REF2}$ is as stable and accurate as the foregoing embodiments. Further, because the embodiment similarly employs the feedback mechanism of the chopper stabilization operational amplifier 201, it also has a high efficiency.

Figure 4:
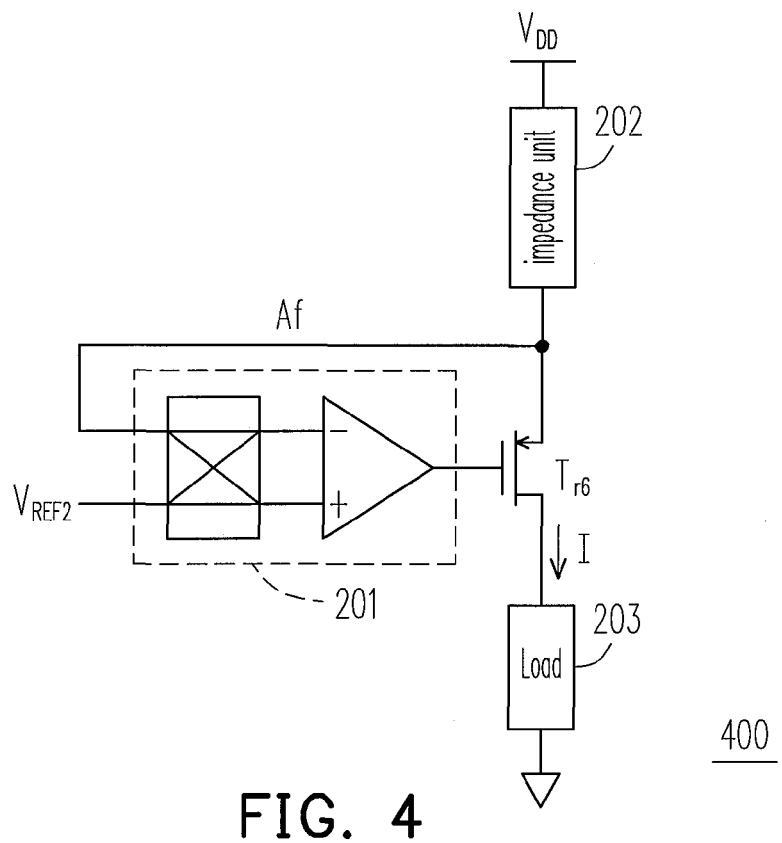
FIG. 4 is a circuit diagram illustrating a current generator according to a further embodiment of the present invention.

FIG. 4 is a circuit diagram illustrating a current generator 400 according to a further embodiment of the present invention. Referring to FIG. 4, a current generator 400 includes a chopper stabilization operational amplifier 201, an impedance unit 202, and a transistor $T_{r6}$. Comparing FIG. 4 with FIG. 3, it can be learnt that in the current embodiment, the transistor $T_{r6}$ is complied with a P-type metal oxide semiconductor (PMOS) transistor; the first input terminal of the chopper stabilization operational amplifier 201 is an inverting input terminal; the second input terminal of the chopper stabilization operational amplifier 201 is a non-inverting input terminal, the first source/drain of the transistor $T_{r6}$ is a source; and the second source/drain of the transistor $T_{r6}$ is a drain. However, the features of the chopper stabilization operational amplifier 201 and the way of generating the current I by the transistor $T_{r6}$ are equivalent with the foregoing embodiments, and therefore the transistor $T_{r6}$ is similarly operated in the linear region. As such, the current embodiment also has a high efficiency, and the current I is also as stable and accurate as the foregoing embodiments.

Figure 5:
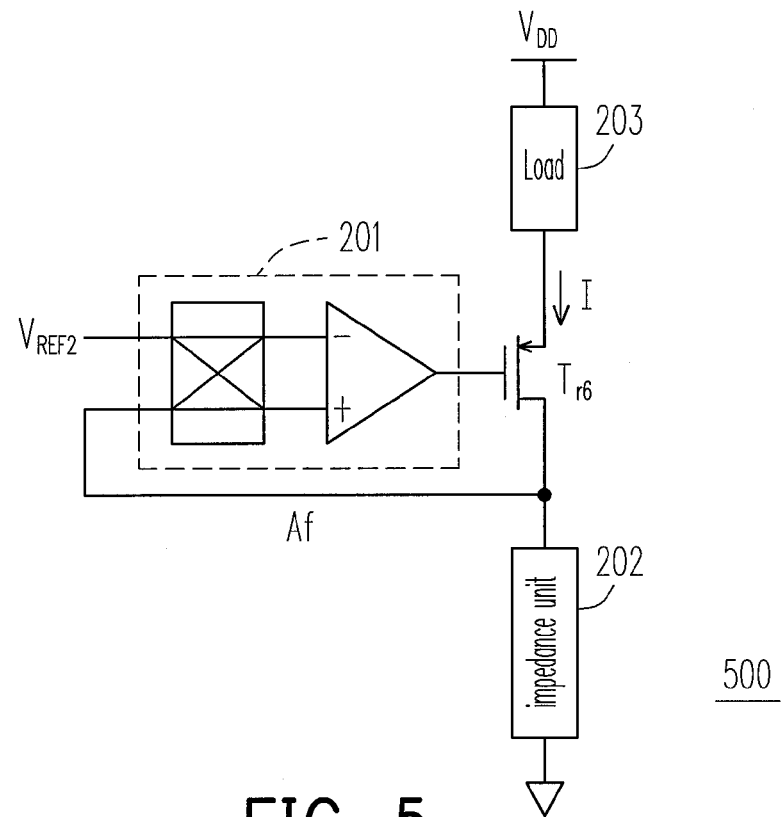
FIG. 5 is a circuit diagram illustrating a current generator according to still a further embodiment of the present invention.

FIG. 5 is a circuit diagram illustrating a current generator 500 according to still a further embodiment of the present invention. Referring to FIG. 5, a current generator 500 includes a chopper stabilization operational amplifier 201, an impedance unit 202, and a transistor $T_{r6}$. Comparing FIG. 5 with FIG. 2, it can be learnt that in the current embodiment, the transistor $T_{r6}$ is complied with a PMOS transistor; the first input terminal of the chopper stabilization operational amplifier 201 is a non-inverting input terminal; the second input terminal of the chopper stabilization operational amplifier 201 is an inverting input terminal, the first source/drain of the transistor $T_{r6}$ is a drain, and the second source/drain of the transistor $T_{r6}$ is a source. However, the features of the chopper stabilization operational amplifier 201 and the way of generating the current I by the transistor $T_{r6}$ are equivalent with the foregoing embodiments, and therefore the transistor $T_{r6}$ is similarly operated in the linear region. As such, the current embodiment also has a high efficiency, and the current I is also as stable and accurate as the foregoing embodiments.

According to the foregoing embodiments, the transistor $T_{r5}$ and the transistor $T_{r6}$ are both operated in the linear region. However, in other embodiments, the transistor $T_{r5}$ and the transistor $T_{r6}$ can also be operated in a saturation region, by which the current generator can improve the stability of the generated current I (i.e., decreasing ripples of the current I).

Figure 6:
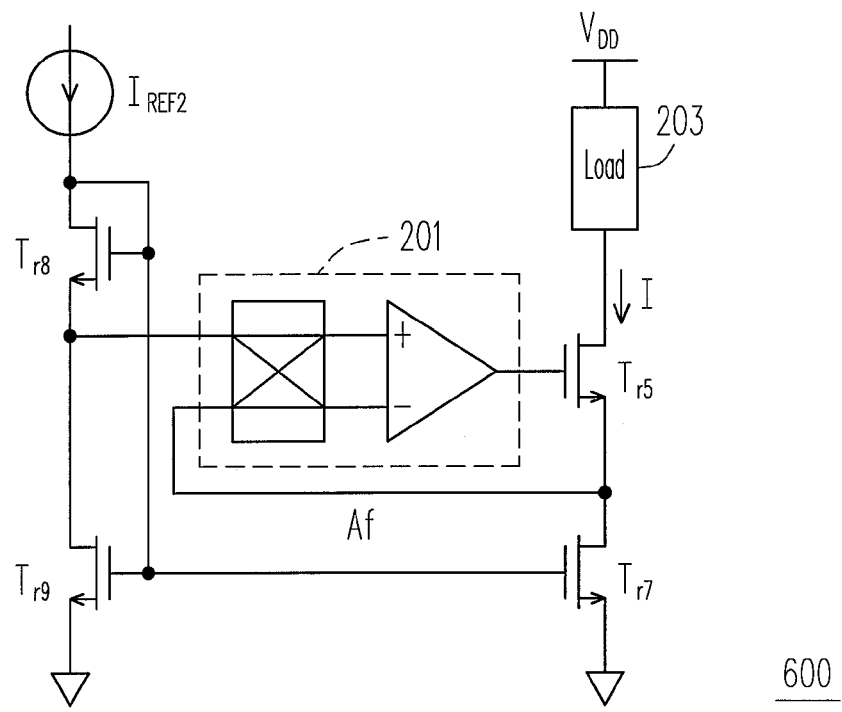
FIG. 6 is a circuit diagram illustrating a current mirror according to an embodiment of the present invention.

Those skilled in the art may apply the current generator according the foregoing embodiments of the present invention for different applications. For example, the current generator can be used in a current mirror circuit. FIG. 6 is a circuit diagram illustrating a current mirror according to an embodiment of the present invention. In the current embodiment, a current generator 600 is used for realizing a current mirror. The current generator 600 includes a chopper stabilization operational amplifier 201, an impedance unit (a second transistor $T_{r7}$ hereby), a transistor $T_{r5}$, a third transistor $T_{r8}$, and a fourth transistor $T_{r9}$.

Referring to FIG. 6, the chopper stabilization operational amplifier 201 includes a first input terminal (exemplified with an inverting input terminal in the current embodiment) coupled to a first source/drain (exemplified with a source in the current embodiment) of the transistor $T_{r5}$, a second input terminal (exemplified with a non-inverting input terminal in the current embodiment) coupled to a first source/drain (exemplified with a source in the current embodiment) of the transistor $T_{r8}$, and an output terminal coupled to a gate of the transistor $T_{r5}$. The transistor $T_{r7}$ includes a drain coupled to the source of the transistor $T_{r5}$, and a source coupled to a first voltage (exemplified with a grounding voltage in the current embodiment). The second source/drain (exemplified with a drain in the current embodiment) of the transistor $T_{r5}$ serves as an output terminal of the current generator 600. A load 203 is coupled between the drain of the transistor $T_{r5}$ and a second voltage (exemplified with a system voltage $V_{DD}$ in the current embodiment). The source of the transistor $T_{r8}$ is coupled to the second input terminal of the chopper stabilization operational amplifier 201. A gate of the transistor $T_{r8}$ is coupled to a second source/drain (exemplified with a drain in the current embodiment) thereof. The drain of the transistor $T_{r8}$ further receives a reference current $I_{REF2}$. A first source/drain (exemplified with a source in the current embodiment) of the transistor $T_{r9}$ is grounded. A second source/drain (exemplified with a drain in the current embodiment) of the transistor $T_{r9}$ is coupled to the source of the transistor $T_{r8}$. A gate of the transistor $T_{r9}$ is coupled to the gate of the transistor $T_{r7}$ and the gate of the transistor $T_{r8}$.

According to the current embodiment, all transistors Tr5, Tr7, Tr8, and Tr9 employed in the current embodiment are NMOS transistors. According to intrinsic characteristics of the transistors, the reference current $I_{REF2}$ flows by the transistors $T_{r8}$ and $T_{r9}$, and generates voltage drops thereby. A voltage received by the non-inverting input terminal of the chopper stabilization operational amplifier 201 is the drain-source voltage drop generated by the transistor $T_{r9}$. According to virtual grounding principle, voltages at the inverting input terminal and the non-inverting input terminal of the chopper stabilization operational amplifier 201 are equivalent. As such, the transistors $T_{r9}$ and $T_{r7}$ present equivalent drain-source voltage drops. Further, because the gates of the transistors $T_{r9}$ and $T_{r7}$ are coupled to one point, they present equivalent gate-source voltage drops. Supposing that the transistors $T_{r9}$ and $T_{r7}$ are designed with identical features, a current I flowing by the transistor $T_{r7}$ must be equivalent to the reference current $I_{REF2}$. The transistor $T_{r5}$ is operated in the linear region according to the feedback mechanism of the chopper stabilization operational amplifier 201. Therefore, the present invention has a high efficiency, and the current I is equivalent to the reference current $I_{REF2}$.

As discussed in the embodiment of FIG. 6, the transistor $T_{r5}$ is operated in the linear region. However, in other embodiments, the transistor $T_{r5}$ can also be operated in a saturation region. In such a way, the current generator according to the present invention can improve the stability of the mirroring current I (decreasing the ripples of the current I).

Figure 7:
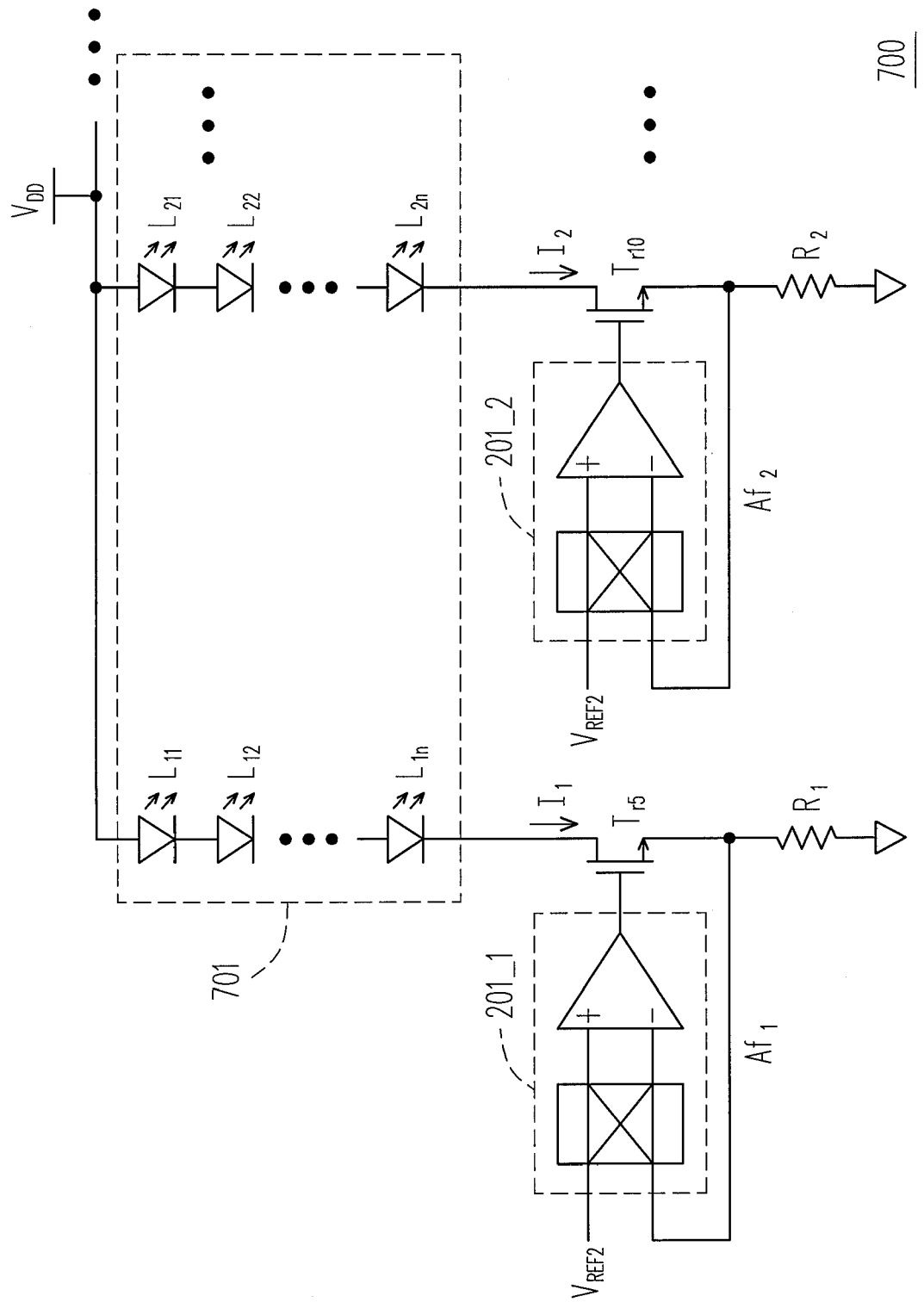
FIG. 7 is a circuit diagram illustrating a current balance circuit applied in an embodiment of the present invention.

The current generator according to the foregoing embodiments of the present invention can also be employed in a current balance circuit. FIG. 7 is a circuit diagram illustrating a current balance circuit applied in an embodiment of the present invention. Referring to FIG. 7, in the current embodiment, a current generator 700 is used for realizing a current balance circuit. The current generator 700 includes a plurality of chopper stabilization operational amplifiers (e.g., 201_1, 201_2, . . . ), a plurality of impedance units (e.g., resistor R1, R2, . . . ), and a plurality of transistors (e.g., transistor $T_{r5}$, $T_{r10}$, . . . ). As shown in FIG. 7, the current embodiment can be taken as a multichannel application of the current generator 200. In other words, each channel can be applied with the current generator 200 of FIG. 2.

In the current embodiment, a load 701 for example is a backlight module. The backlight module 701 includes a plurality of light emitting diode (LED) series, (e.g., LED series $L_{11}$ through $L_{1n}$, LED series $L_{21}$ through $L_{2n}$, . . . ). As discussed above with respect to the embodiment of FIG. 2, it can be learnt that circuit characteristics of all channels are equivalent (e.g., aspect ratios of the transistors $T_{r5}$ and $T_{r10}$ are equivalent, and resistance values of the resistor R1 and R2 are equivalent), and when similarly receiving the reference voltage $V_{REF2}$, feedback signals $Af_1$, $Af_2$ are also equivalent. As such, currents $I_1$, $I_2$ provided by the channels are also equivalent. According to the current embodiment, because of the employment of the feedback mechanism of the chopper stabilization operational amplifies 201_1, 201_2, . . . , offset voltages of the chopper stabilization operational amplifies of different channels are eliminated. In such a way, different currents $I_1$, $I_2$, ... of the channels achieve a high matching. Therefore, all currents of the channels are equivalent, and the transistors $T_{r5}$, $T_{r10}$, ..., are operated in the linear region, and thus the circuit has a high efficiency, and a high current matching. According to the current embodiment, the backlight module is adapted to obtain a uniform brightness, and the brightness can be conveniently adjusted by adjusting the reference voltage $V_{REF2}$.

Figure 8:
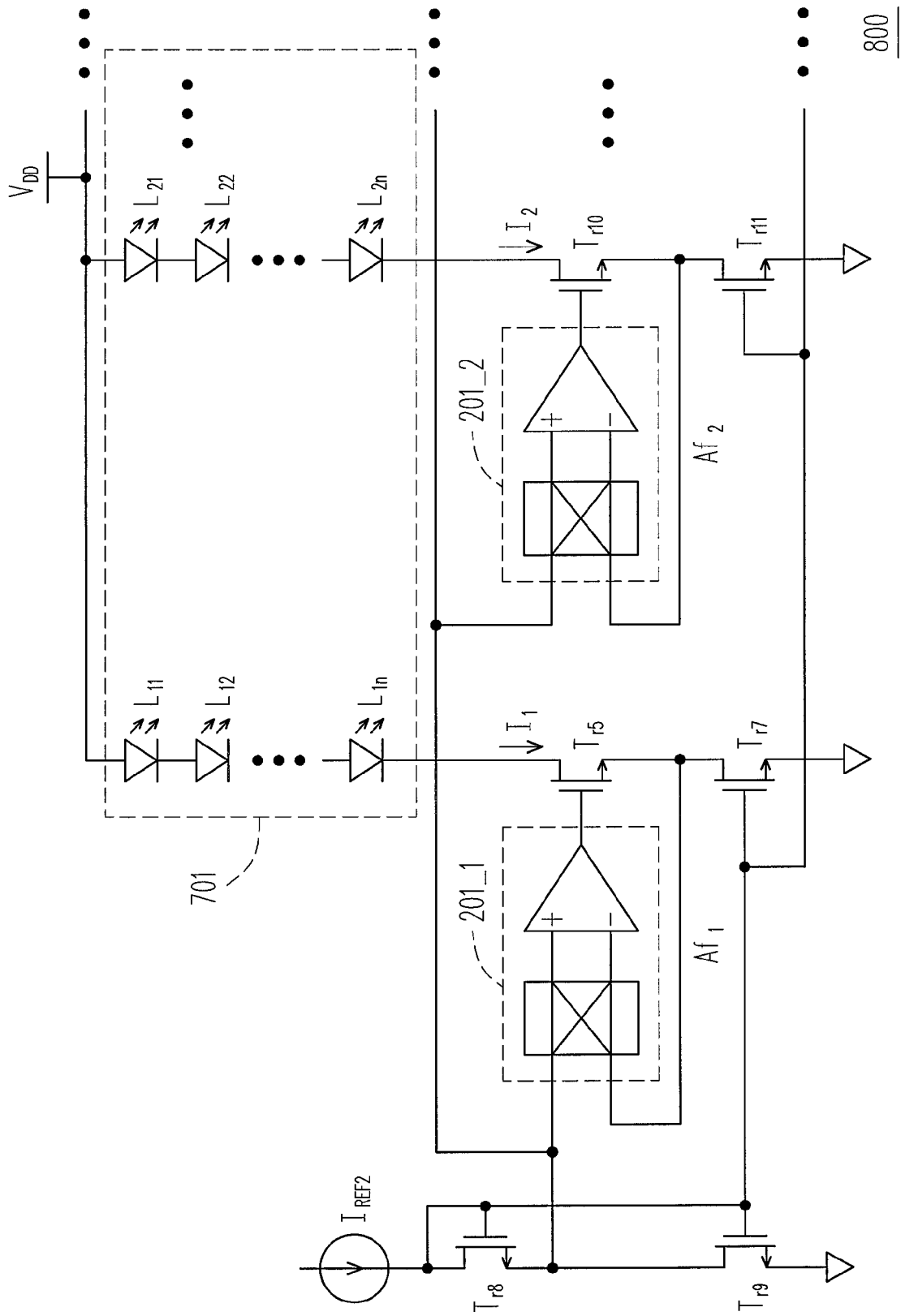
FIG. 8 is circuit diagram illustrating a multichannel current mirror applied in an embodiment of the present invention.

Further, the current generator of the foregoing embodiments can also be employed in a multichannel current mirror. FIG. 8 is circuit diagram illustrating a multichannel current mirror applied in an embodiment of the present invention. In the current embodiment, a current generator 800 is used for realizing a multichannel current mirror. The current generator 800 includes a plurality of chopper stabilization operational amplifiers (e.g., 201_1, 201_2, ...), a plurality of transistors (e.g., transistor $T_{r5}$, $T_{r10}$, ...), and a plurality of impedance units (e.g., second transistor $T_{r7}$, $Tr_{11}$, ...), a third transistor $T_{r8}$, and a fourth transistor $T_{r9}$. Referring to FIG. 8, the current embodiment can be taken as a multichannel application of the current generator 600 of FIG. 6. In the current embodiment, the chopper stabilization operational amplifiers 201_1, and 201_2 have equivalent characteristics; the transistors $T_{r5}$ and $T_{r10}$ having equivalent characteristics; and the transistors $T_{r7}$ and $T_{r11}$ have equivalent characteristics. As such, the first channel (transistors $T_{r5}$ and $T_{r7}$) and the second channel (transistors $T_{r10}$ and $Tr_{11}$) have equivalent characteristics.

In the current embodiment, a load 701 is for example a backlight module. The backlight module 701 includes a plurality of LED series, (e.g., LED series $L_{11}$ through $L_{1n}$, LED series $L_{21}$ through $L_{2n}$, ...). As discussed above with respect to the embodiment of FIG. 6, it can be learnt that currents $I_1$ and $I_2$ of the channels are equivalent to the reference current $I_{REF2}$.

Figure 9:
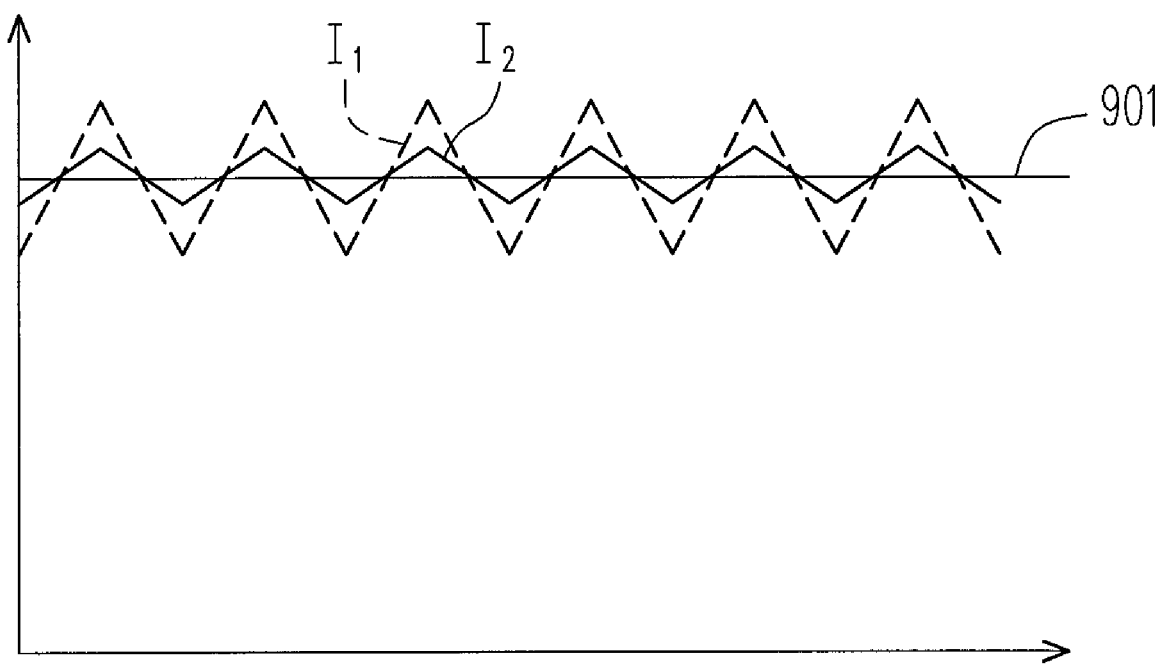
FIG. 9 is a current waveform diagram illustrating the embodiment of FIG. 8.

FIG. 9 is a current waveform diagram illustrating the embodiment of FIG. 8. Referring to FIGS. 8 and 9 together, a switching period of the chopper stabilization operational amplifiers 201_1, 201_2 causes the currents $I_1$ and $I_2$ to each generate an alternate current (AC) ripple noise at their direct current (DC) levels, respectively. Periods of the AC ripple noises are directly proportional with the period of the switch of the chopper stabilization operational amplifiers 201_1, 201_2, while different offset voltages of the operational amplifiers cause different amplitudes of the ripples. However, the currents $I_1$ and $I_2$ are assured to have equivalent average current values, which can be considered as a DC level 901 as shown in FIG. 9. According to some applications, the matching of the DC level 901 is a major concern of system design.

In summary, the present invention employs a feedback mechanism of a chopper stabilization operational amplifier in a current generator, in which it utilizes a chopper stabilization technology for eliminating the affection on the current matching caused by the offset voltages inputted by the operational amplifiers, and thus obtaining a high current matching of the currents of the channels. Meanwhile, the feedback mechanism of the operational amplifiers allows the transistors to operate in a saturation region, thus improving the stability of the currents of the channels. Or according to the practical application, the transistors are controlled to operate in the linear region, so as to ensure that the voltage drops between drain-sources of the transistors are controlled within a lowest range, for obtaining a high efficiency in its entirety.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current generator, comprising:

a chopper stabilization operational amplifier, comprising a first input terminal, a second input terminal, and an output terminal, wherein the chopper stabilization operational amplifier is adapted for eliminating a low frequency noise and an offset voltage;

a transistor, comprising a gate coupled to the output terminal of the chopper stabilization operational amplifier, a first source/drain coupled to the first input terminal of the chopper stabilization operational amplifier, and a second source/drain serving as a current output terminal of the current generator;

an impedance unit comprising a first terminal coupled to the first source/drain of the transistor, and a second terminal coupled to a first voltage, wherein the impedance unit is a second transistor, the current generator further comprising:

a third transistor, comprising a first source/drain, a second source/drain and a gate, wherein the first source/drain of the third transistor coupled to the second input terminal of the chopper stabilization operational amplifier, the gate of the third transistor coupled to the second source/drain of the third transistor, and the second source/drain receiving a reference current; and a fourth transistor, comprising a first source/drain coupled to the first voltage, a second source/drain coupled to the first source/drain of the third transistor, and a gate coupled to a gate of the second transistor and the gate of the third transistor.

2. The current generator according to claim 1, wherein a load is coupled between the current output terminal of the current generator and a second voltage, and the first voltage and the second voltage are a system voltage and a grounding voltage, respectively.

3. The current generator according to claim 1, wherein a load is coupled between the current output terminal of the current generator and a second voltage, and the first voltage and the second voltage are a grounding voltage and a system voltage, respectively.

4. The current generator according to claim 1, wherein the transistor is a P-type metal oxide semiconductor (PMOS) transistor.

5. The current generator according to claim 1, wherein the transistor is an N-type metal oxide semiconductor (NMOS) transistor.

6. The current generator according to claim 1, wherein the chopper stabilization operational amplifier comprises:

a first switch, comprising a first terminal, a second terminal, a third terminal, and a fourth terminal, and being adapted for selecting to couple the first terminal and the second terminal of the first switch to the third terminal and the fourth terminal of the first switch respectively, or to the fourth terminal and the third terminal of the first switch respectively, wherein the first terminal and the second terminal of the first switch serve as the first input terminal and the second input terminal of the chopper stabilization operational amplifier, respectively;

an amplifier, comprising a first input terminal, a second input terminal, a first output terminal and a second output terminal, wherein the first input terminal and the second input terminal of the amplifier are respectively coupled with the third terminal and the fourth terminal of the first switch; and a second switch, comprising a first terminal, a second terminal, a third terminal, and a fourth terminal, and being adapted for selecting to electrically couple the first terminal and the second terminal of the second switch to the third terminal and the fourth terminal of the second switch respectively, or to the fourth terminal and the third terminal of the second switch respectively, wherein the first terminal and the second terminal of the second switch are respectively coupled with the first output terminal and the second output terminal of the amplifier, respectively, and the third terminal of the second switch serves as the output terminal of the chopper stabilization operational amplifier.

7. The current generator according to claim 1, wherein the second transistor, the third transistor, and the fourth transistor are all NMOS transistors.

8. The current generator according to claim 1, wherein the transistor is operated in a saturation region.

9. The current generator according to claim 1, wherein the transistor is operated in a linear region.

* * * * *